(12) United States Patent
Naber et al.

(10) Patent No.: US 11,742,108 B1
(45) Date of Patent: Aug. 29, 2023

(54) OPERATION AND INSULATION TECHNIQUES

(71) Applicant: Altec Industries, Inc., Birmingham, AL (US)

(72) Inventors: William Naber, Saint Joseph, MO (US); Timothy J. Mourlam, Shawnee, KS (US); David Lindquist, Cameron, MO (US); Jonathan Westin Sykes, Gower, MO (US)

(73) Assignee: Altec Industries, Inc., Birmingham, AL (US)

( * ) Notice: Subject to any disclaimer, the term of this patent is extended or adjusted under 35 U.S.C. 154(b) by 0 days.

(21) Appl. No.: 17/875,821

(22) Filed: Jul. 28, 2022

(51) Int. Cl.
| | | |
|---|---|---|
| *B25J 19/02* | (2006.01) | |
| *H01B 7/02* | (2006.01) | |
| *B25J 9/16* | (2006.01) | |
| *H01Q 1/38* | (2006.01) | |
| *G01R 31/52* | (2020.01) | |

(52) U.S. Cl.
CPC .............. *H01B 7/02* (2013.01); *B25J 9/1669* (2013.01); *B25J 19/023* (2013.01); *G01R 31/52* (2020.01); *H01Q 1/38* (2013.01)

(58) Field of Classification Search
CPC ......... H01B 7/02; B25J 9/1669; B25J 19/023; G01R 31/52; H01Q 1/38
See application file for complete search history.

(56) References Cited

U.S. PATENT DOCUMENTS

| | | |
|---|---|---|
| 3,139,948 A | 7/1964 | Rorden |
| 4,831,662 A | 5/1989 | Kuhn |
| 5,196,998 A | 3/1993 | Fulton |
| 6,250,588 B1 | 6/2001 | Numbers |
| 6,325,749 B1 | 12/2001 | Inokuchi et al. |
| 6,507,163 B1 | 1/2003 | Allen |
| 7,224,382 B2 | 5/2007 | Baker |
| 2003/0174286 A1 | 9/2003 | Trumbull |
| 2006/0045294 A1 | 3/2006 | Smyth |
| 2007/0192910 A1 | 8/2007 | Vu et al. |
| 2014/0014637 A1 | 1/2014 | Hunt et al. |
| 2015/0015708 A1 | 1/2015 | Collett et al. |
| 2015/0312468 A1 | 10/2015 | Taylor et al. |
| 2017/0340969 A1 | 11/2017 | Lim et al. |
| 2018/0011681 A1 | 1/2018 | Kada |
| 2018/0032130 A1 | 2/2018 | Meglan |
| 2018/0037172 A1 | 2/2018 | Nelson et al. |

(Continued)

FOREIGN PATENT DOCUMENTS

| | | | | |
|---|---|---|---|---|
| CN | 107053188 A | * | 8/2017 | .............. B25J 11/00 |
| JP | 5285880 B2 | | 9/2013 | |

OTHER PUBLICATIONS

Faucher et al. "Ground operated teleoperation system for live power line maintenance" (Year: 1996).

(Continued)

*Primary Examiner* — David E Lotter
(74) *Attorney, Agent, or Firm* — Erise IP, P.A.

(57) ABSTRACT

Systems and methods for establishing and maintaining an electrical bonding connection between remotely operated equipment and an energized power line using one or more robotic arms disposed on the remotely operated equipment. Sensory information is communicated to an operator at a remote location across a dielectric gap to maintain electrical isolation of the remotely operated equipment.

20 Claims, 9 Drawing Sheets

(56) References Cited

U.S. PATENT DOCUMENTS

| | | |
|---|---|---|
| 2018/0057322 A1 | 3/2018 | Schiller |
| 2018/0243921 A1 | 8/2018 | Hashimoto et al. |
| 2018/0313885 A1 | 11/2018 | Bilic et al. |
| 2020/0139227 A1 | 5/2020 | Mikhailov |
| 2022/0203562 A1* | 6/2022 | Brown .................. B25J 9/1697 |

OTHER PUBLICATIONS

Aracil et al. "ROBTET a new teleoperated system for live-line maintenance" (Year: 1995).
Du et al. "A teleoperated robotic hot stick platform for the overhead live powerline maintenance tasks" (Year: 2019).
Aracil et al. "Advanced Teleoperated System for Live Power Line Maintenance" (Year: 2001).
R. Aracil et al.; ROBTET: a new teleoperated system for live-line maintenance; IEEE; Nov. 1995; pp. 1-8.
Liang Du et al.; A teleoperated robotic hot stick platform for the overhead live powerline maintenance tasks; IEEE; 2019; pp. 1-6.
D. Faucher et al.; Ground Operated Teleoperation System for Live Power Line Maintenance; IEEE; Oct. 1996; pp. 1-7.

* cited by examiner

OPERATION AND INSULATION TECHNIQUES

BACKGROUND

1. Field

Embodiments of the invention relate to operation and electrical insulation techniques of an aerial device. More specifically, embodiments of the invention relate to operational and electrical insulation techniques for an aerial device with respect to a power line.

2. Related Art

Typically, maintenance and other operations on power lines are performed manually by operators from within a bucket of an aerial device. Accordingly, in some cases, operators come into close contact with energized power lines at relatively high electrical potential. Such manual operation typically requires extensive pre-operation inspections to ensure that the electrical insulation properties of the aerial device and other equipment are adequate before performing work.

Existing systems and methods have been provided for performing maintenance on power lines remotely using automation and remotely controlled means. However, these existing systems and methods are not capable of electrically bonding to an energized power line and thus, require the power line to be disconnected or turned off before performing work, which leads to expensive down time of the power line.

SUMMARY

Embodiments of the invention solve the above-mentioned problems by providing systems and methods for using a remotely operated robotic assembly of an aerial device to electrically bond to an energized power line and electrically insulate a portion of the aerial device from ground potential to thereby prevent electrical shock.

In a first embodiment, the techniques described herein relate to a method of providing electrical insulation for an aerial device during operation on an energized power line, the method including establishing, via one or more robotic arms of the aerial device, an electrical connection between the energized power line and a portion of the aerial device with an electrical bonding cable to maintain the portion of the aerial device at an electrical potential of the energized power line, monitoring an electrical bonding condition of the aerial device, transmitting a notification to a user device associated with an operator in a remote location, the notification indicative of the electrical bonding condition of the aerial device, while electrically bonded to the energized power line, transmitting a communication signal across a dielectric gap from the portion of the aerial device to the operator, the communication signal including sensory information associated with the one or more robotic arms, monitoring an electrical current leakage of the aerial device, and transmitting a subsequent notification to the operator, the subsequent notification indicative of the electrical current leakage of the aerial device.

In a second embodiment, the techniques described herein relate to the method of embodiment one, further including displaying the notification and the subsequent notification to the operator within a display of the user device.

In a third embodiment, the techniques described herein relate to the method of embodiments one and two, further including determining, using one or more electric field sensors, an electrical voltage potential of an object in a vicinity of the aerial device, and transmitting a voltage notification including information of the electrical voltage potential of the object in the vicinity of the aerial device to the operator.

In a fourth embodiment, the techniques described herein relate to the method of embodiments one, two, and three, wherein the electrical connection between the energized power line and the portion of the aerial device is established automatically using an automated electrical bonding routine of the one or more robotic arms.

In a fifth embodiment, the techniques described herein relate to the method of embodiments one, two, three, and four, wherein the automated electrical bonding routine includes installing, using the one or more robotic arms, a conductive clamp over the energized power line, the conductive clamp coupled to the electrical bonding cable, wherein the conductive clamp is adapted to be grasped by a gripping tool disposed at an end of the one or more robotic arms.

In a sixth embodiment, the techniques described herein relate to the method of embodiments one, two, three, four, and five, further including prior to establishing the electrical connection with the energized power line, installing, via the one or more robotic arms, an insulated blanket assembly over another energized power line in proximity to the energized power line, the insulated blanket assembly including an insulated blanket, one or more blanket holders disposed at respective ends of the insulated blanket, and one or more robot interface adapters disposed on the one or more blanket holders configured to be grasped by a gripping tool of the one or more robotic arms.

In a seventh embodiment, the techniques described herein relate to the method of embodiments one through six, further including while electrically bonded to the energized power line, monitoring a space adjacent to the aerial device to identify one or more objects intruding the space, and responsive to identifying one or more objects intruding the space, transmitting an intrusion notification to the user device of the operator.

In an eighth embodiment, the techniques described herein relate to an electrical insulation system for an aerial device configured to operate on an energized power line, the electrical insulation system including a robotic assembly disposed at a distal end of the aerial device, the robotic assembly including one or more robotic arms configured to be at least partially controlled remotely by an operator in a remote location, a camera assembly disposed at the distal end of the aerial device in proximity to the robotic assembly, the camera assembly including a camera mount secured to the distal end of the aerial device, and one or more cameras supported by the camera mount, the camera mount configured to continuously capture image data associated with the robotic assembly, and at least one processor programmed to perform a method of providing electrical insulation, the method including establishing, via the one or more robotic arms of the robotic assembly, an electrical connection between the energized power line and a portion of the aerial device with an electrical bonding cable to maintain the portion of the aerial device at an electrical potential of the energized power line, monitoring an electrical bonding condition of the aerial device, transmitting a notification to a user device of an operator, the notification indicative of the electrical bonding condition of the aerial device, and while electrically bonded to the energized power line, transmitting a communication signal across a dielectric gap from the portion of the aerial device to the operator, the communication signal including the continuously captured image data associated with the robotic assembly.

In a ninth embodiment, the techniques described herein relate to the electrical insulation system of embodiment eight, wherein the user device includes a headset and the notification is displayed to the operator within a display of the headset.

In a tenth embodiment, the techniques described herein relate to the electrical insulation system of embodiments eight and nine, further including one or more insulated tools interfacing with an end of the one or more robotic arms.

In an eleventh embodiment, the techniques described herein relate to the electrical insulation system of embodiments eight through ten, further including a power source disposed at the distal end of the aerial device in proximity to the robotic assembly, the power source configured to provide electrical power to the robotic assembly and the camera assembly.

In a twelfth embodiment, the techniques described herein relate to the electrical insulation system of embodiments eight through eleven, further including a hook gripping tool including a retractable hook disposed at an end of the one or more robotic arms configured to grasp one or more objects by selectably retracting the retractable hook based on an actuation by the one or more robotic arms.

In a thirteenth embodiment, the techniques described herein relate to the electrical insulation system of embodiments eight through twelve, further including an insulated blanket assembly configured to be placed over the energized power line, the insulated blanket assembly including an insulated blanket, one or more blanket holders disposed at respective ends of the insulated blanket, the one or more blanket holders configured to lock the insulated blanket assembly onto the energized power line, and one or more robot interface adapters disposed on the one or more blanket holders configured to be grasped by a gripping tool of the one or more robotic arms.

In a fourteenth embodiment, the techniques described herein relate to the electrical insulation system of embodiments eight through thirteen, further including a fiber-optic cable disposed between the robotic assembly and the user device for communicatively coupling the robotic assembly and the user device while maintaining electrical isolation between the robotic assembly and a ground electrical potential.

In a fifteenth embodiment, the techniques described herein relate to a method of providing electrical insulation for remotely operated equipment during operation on an energized power line, the method including establishing, via one or more robotic arms of the remotely operated equipment, an electrical connection between the energized power line and a portion of the remotely operated equipment to maintain the portion of the remotely operated equipment at an electrical potential of the energized power line, electrically isolating, via one or more electrically insulated portions of the remotely operated equipment, the portion of the remotely operated equipment at the electrical potential of the energized power line from another portion of the remotely operated equipment to prevent electrical current from traveling through the remotely operated equipment, monitoring an electrical bonding condition of the remotely operated equipment, transmitting a notification to a user device associated with an operator in a remote location, the notification indicative of the electrical bonding condition of the remotely operated equipment, and while electrically bonded to the energized power line, transmitting a communication signal across a dielectric gap from the portion of the remotely operated equipment to the operator, the communication signal including sensory information associated with the one or more robotic arms.

In a sixteenth embodiment, the techniques described herein relate to the method of embodiment fifteen, further including monitoring an electrical current leakage of the remotely operated equipment, and transmitting a subsequent notification to the operator, the subsequent notification indicative of the electrical current leakage of the remotely operated equipment.

In a seventeenth embodiment, the techniques described herein relate to the method of embodiments fifteen and sixteen, further including determining, using one or more electric field sensors, an electrical voltage potential of an object in a vicinity of the remotely operated equipment, and transmitting a voltage notification including information of the electrical voltage potential of the object in the vicinity of the remotely operated equipment to the operator.

In an eighteenth embodiment, the techniques described herein relate to the method of embodiments fifteen through seventeen, further including generating a user interface for display within the user device of the operator, the user interface including the notification indicative of the electrical bonding condition of the remotely operated equipment, and the voltage notification including information of the electrical voltage potential of the object in the vicinity of the remotely operated equipment.

In a nineteenth embodiment, the techniques described herein relate to the method of embodiments fifteen through eighteen, wherein the user device includes a headset and the user interface is displayed to the operator within a display of the headset.

In a twentieth embodiment, the techniques described herein relate to the method of embodiments fifteen through nineteen, further including disposing one or more electrically insulated covers over the robotic arms of the remotely operated equipment.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
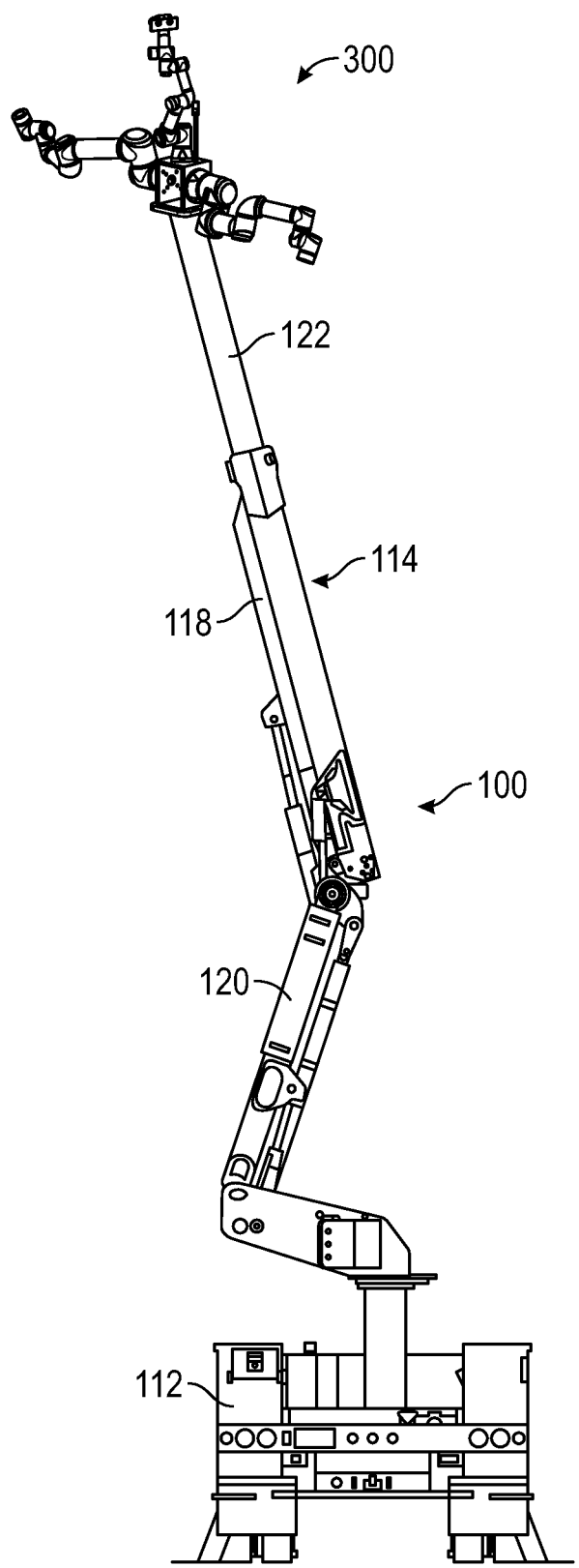
FIG. 1 depicts an aerial device relating to some embodiments.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized, and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

Generally, embodiments of the current disclosure relate to systems and methods for providing electrical isolation for remotely operated equipment. In some embodiments, the remotely operated equipment may be used to establish and maintain an electrical connection with an energized power line, for example, by using one or more robotic arms to attach an electrical bonding cable to the energized power line.

FIG. 1 depicts an aerial device 100 relating to some embodiments. The aerial device 100 comprises a utility vehicle 112, a boom assembly 114, and a remote assembly system 300. The boom assembly 114 comprises a boom 118 having a boom proximal end 120 and a boom distal end 122. In some embodiments, the boom 118 is one of a telescoping boom and an articulating boom. The boom assembly 114 may be attached to the utility vehicle 112 at the boom proximal end 120. The remote assembly system 300 may be secured to the boom distal end 122, such that the remote assembly system 300 is supported by the boom assembly 114. In some embodiments, and as described in greater detail below, the remote assembly system 300 may comprise at least a robot unit adapted for performing telecommunications repair, powerline repair, general repair work, or other actions that may be performed by a robot. For example, the robot unit may comprise one or more utility tools for performing actions such as sawing, cutting, screwing, wiring, or other actions associated with repair work. In some embodiments, the boom 118 is used to position the remote assembly system 300 in a remote location, such as, for example adjacent to an energized power line.

Broadly, aspects of the present disclosure are directed to a remotely controllable robot unit comprising an image and sensory capturing system and at least one utility arm for performing actions. As described herein, the robot unit may be controlled remotely by an operator to perform actions, such as powerline repair work. Through such remote control, the operator is removed from any potentially dangerous situations. To provide the operator with visual, sensory, and other information, the robot unit may further comprise a sensory capturing system comprising at least a camera and a three-dimensional depth camera. Video information may be provided to the operator through a virtual reality ("VR") headset and the operator may issue commands through joysticks or other controllers to instruct the robot unit to perform an action. To aid the operator and/or the robot unit in performing actions efficiently and correctly, three-dimensional depth information may be captured by the three-dimensional depth camera for generating a three-dimensional representation of the field of view at a computer. Accordingly, the computer can receive instructions, compare the instructions to the three-dimensional representation, and cause the robot unit to perform an action based on the instructions and the three-dimensional representation. To further aid in providing a realistic and immersive experience to the operator, the robot unit may comprise a six degree-of-freedom ("DOF") camera mount for mimicking or replicating the movement of the operator. Accordingly, in addition to movement in the x, y, and z plane, the robot unit can further control pitch, yaw, and roll of the camera mount, However, it will be appreciated that particular embodiments and applications of the present teachings may vary, including any of the examples provided herein. For example, the present disclosure may be utilized in a variety of applications, including but not limited to military applications, construction applications, rescue applications, health and safety applications or other applications that robotics may be utilized. Accordingly, it will be appreciated that specific embodiments or details provided herein are intended to be illustrative, rather than limiting.

Figure 2:
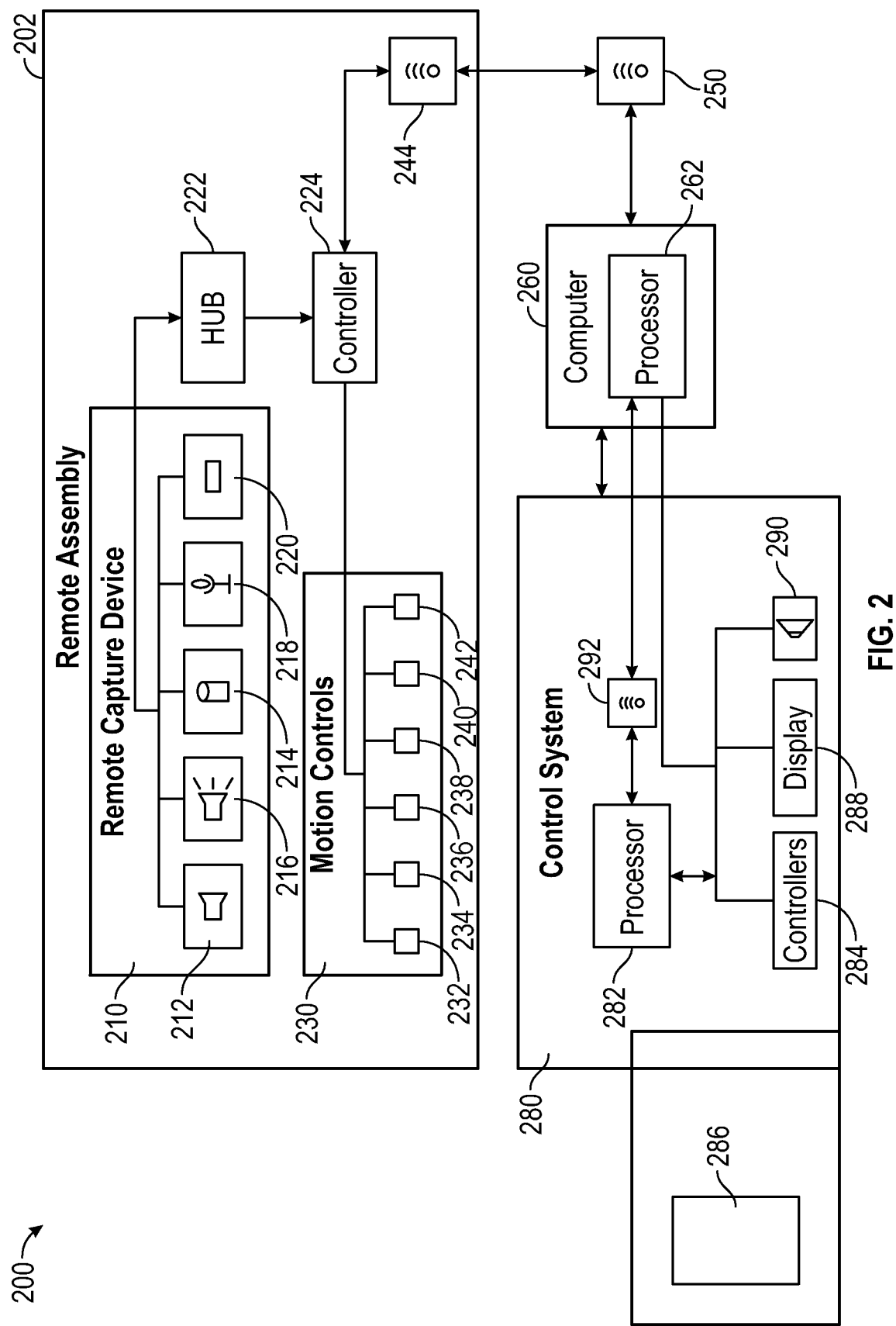
FIG. 2 depicts an exemplary system architecture of a robot unit and manual controls relating to some embodiments.

FIG. 2 depicts an exemplary block diagram 200 related to some embodiments. In some embodiments, the remote assembly system 300 comprises various assemblies, subassemblies, parts, or components for capturing sensory information and/or for performing actions, such as repair work in a telecommunication setting. The remote assembly system 300 may comprise various circuitry, parts, or other components for capturing sensory information, including video, three-dimensional depth information, audio, and other sensory data. Further, the remote assembly system 300 may comprise a manually controlled or autonomous robot unit that may be positioned at the end of the boom assembly 114 for interacting with a work site to perform one or more task. For example, as described above, in many real-life scenarios, tasks to be performed may not be discovered until reaching the job site, and accordingly, the robot unit may comprise a variety of tools, features, or functions to respond to a variety of different tasks. Additionally, as described in greater detail below, remote robot assembly may further comprise one or more parts, components, or features for providing an operator with sensory information, providing the operator with additional information about the job site to improve efficiency, efficacy, and/or safety of both the remote assembly system 300 and the operator.

As depicted in the block diagram 200, a remote robot assembly 202 comprises at least a remote capture device 210, a computer 260, and a control system 280. In some embodiments, and as described in greater detail herein, the remote capture device 210 may be a device configured and adapted for the capturing of sensory information and may be positioned on a robot unit for the capturing of sensory information that may be utilized by computer 260, to present information to an operator via control system, among other purposes. FIG. 2 depicts exemplary sensors, cameras, and other apparatuses that may be utilized by remote capture device 210 for the capturing of sensory information. As described in greater detail below, remote capture device 210 may be mounted or positioned on a selectively movable mount or portion of a robot unit. For example, the robot unit may be a robot unit positioned at the end of a boom assembly for aerial application. However, remote capture device 210 may also be used with a robot unit that is not attached on a boom assembly, and for example, may be utilized with a robot unit for ground application or attached to a mechanical arm or an aerial drone. Accordingly, via the robot unit, sensory information may be captured by remote capture device 210.

Through selective inputs, including both manually inputted instructions and/or automated instructions, remote capture device 210 may capture video, still images, three-dimensional depth information, audio, electrical conductivity, voltage, among other information that may be captured by a sensor or recording device. For example, remote capture device 210 may comprise at least one camera 212 for the capturing of video or still images (collectively, "video"). The at least one camera 212 may be a camera positioned on remote capture device 210 for the capturing of video within a selected field of view. The resolution of the video captured by camera 212 may vary, but in some embodiments, camera 212 may be a camera configured for capturing in at least 720p resolution but may capture in higher resolution including but not limited to 1080p, 2K, 4K, or 8K resolution. However, it will be appreciated that the camera 212 may be any currently known or yet to be discovered camera for capturing video. Video captured from camera 212 may be stored locally at remote capture device at a local memory 214. The storing of video at local memory 214 may aid in providing a failsafe or backup storage of captured video in the event of a transmission or upload failure. Further, the storing of video at local memory 214 may aid in situations of poor wireless connection or if a direct line becomes loos or interrupted, preventing the immediate transmission of captured video. Optionally or additionally, video captured from camera 212 may be transmitted to computer 260 for processing, analyzing, storage, and/or for later transmitting to control system 280. In further embodiments, video captured from camera 212 may be directly transmitted to control system 280 for processing.

In some embodiments, remote capture device 210 may further comprise at least one three-dimensional camera 216 or other device configured for capturing three-dimensional depth information. As described in greater detail below, the three-dimensional depth camera 216 may be utilized for capturing three-dimensional depth information within a field of view for creating a point cloud, 3-D model, or other digital representation of an object or area scanned or viewed by the three-dimensional camera 216. Three-dimensional camera 216 may be operated in conjunction with, or independent from camera 212 or other components or parts of remote assembly 202 and/or remote capture device 210. As described in greater detail below, in response to instructions or an input, three-dimensional camera 216 may begin capturing three-dimensional depth information about an object or area within a field of view. Like the captured video with respect to camera 212, the three-dimensional depth information captured by three-dimensional camera 216 may be saved locally at memory 214. In some embodiments, remote capture device 210 may comprise a separate memory 214 for video captured by camera 212 and a separate memory 214 for three-dimensional information captured by three-dimensional camera 216. As described in greater detail below, remote capture device 210 may comprise a microphone 218 and/or at least one sensor 220 for capturing additional sensory information. Accordingly, in some embodiments, a separate and distinct memory 214 may be used for each sensory capture device (i.e., camera 212, three-dimensional camera 216, microphone 218, and/or sensor 220). In further embodiments, remote capture device 210 may comprise a single memory 214 for the storing of all captured sensory information. As described above and in further embodiments, three-dimensional information may be directly sent to computer 260 in addition to or instead of storing locally at memory 214.

In addition to capturing video and/or three-dimensional information, it may also be advantageous for remote capture device 210 to capture additional sensory information that may be presented to an operator or processed by computer 260. For example, in certain scenarios it may be advantageous for remote capture device 210 to capture audio via at least one microphone 218. Continuing with the running example, a remote assembly 202 for use with telecommunications repair may utilize audio information for diagnostic or safety purposes. For example, audio information may capture the sounds of the job site and the audio information may be processed to determine if a job site is safe. Accordingly, in some embodiments, remote capture device 210 may comprise at least one microphone 218 for the capturing of audio information. Similar to the video and three-dimensional information as described above, captured audio information may be stored locally at a memory 214 and/or transmitted to a computer 260 and/or control system 280.

Similar to audio information, remote capture device 210 may further comprise one or more sensors 220 for the capturing of additional sensory information, metrics, or data. For example, continuing with the running example, the remote capture device 210 may be used with a remote assembly 202 positioned at the end of boom assembly 114 for telecommunication or powerline work. In such a work application, the remote assembly 202 may be working on or near live powerline or other conductive lines transferring electricity. Accordingly, in some embodiments, remote capture device 210 may comprise at least one sensor 220 configured as an electricity sensor for determining whether a cable or powerline has electricity running through it. However, it will be appreciated that remote capture device 210 may comprise additional sensors 220 configured and adapted for providing remote capture device and/or remote assembly 202 with additional information. By way of non-limiting example, sensor 220 may comprise any of the following sensors: a gyroscope, an accelerometer, a thermometer, a barometer, a light emitter, among other sensors that may be utilized in the intended application of remote assembly 202.

In some embodiments, the remote assembly 202 may further comprise at least one digital Hub 220. In some embodiments, the remote assembly 202 further comprises at least one digital Hub 222. The digital Hub 22 may receive the captured sensory information from remote capture device and convert the captured sensory information into a format suitable for transmitting to computer 260 and/or control system 280. In some embodiments, the digital Hub 222 is a USB Hub, such as, for example, a USB 3.0.

As further depicted in FIG. 2, remote assembly 202 may further comprise a controller 224. In some embodiments, controller 224 may be a processor or other circuitry or computer hardware for receiving commands or instructions from control system 280 and/or computer 260 and for relaying or providing commands to remote capture device 210 and/or motion controls 230. Accordingly, in some embodiments, instructions or commands from controller 224 may be sent to remote capture device 210. For example, instructions sent from controller 224 to remote capture device 210 may include instructions to begin recording video via camera 212. However, it will be appreciated that instructions sent from controller 224 may cause any of the components of remote capture device 210 to begin capturing sensory information, including but not limited to three-dimensional information, audio information, or other sensory information captured by any of the sensors 220 of remote capture device 210. Additionally, controller 224 may be used to send instructions to cause remote assembly 202, remote capture device 210, and/or motion controls 230 to perform other actions corresponding to the instructions. For example, instructions from controller 224 may instruct remote capture device 210 to store captured sensory information on memory 214. Additionally, instructions from controller 224 may be sent to motion controls 230 to instruct remote assembly 202 to perform a movement. Further, controller 224 may be in communication with transceiver 244 for communicating with computer 260 and/or control system 280 to send sensory information or other data or information to computer 260 and/or control system 280. Similarly, controller 224 may further be configured for receiving instructions, commands, or other information from computer 260 and/or control system 280.

As further depicted in the block diagram of FIG. 2 and in some embodiments, remote assembly 202 may further comprise motion controls 230. Motion controls 230 may be configured and adapted for controlling the movement of remote assembly 202, including any utility arms or camera mounts as described in greater detail below. In some embodiments, remote assembly 202 may be comprise a 6 DOF robot unit configured with utility arms and/or camera mounts that can move with 6 DOF. Accordingly, motion controls 230 may be configured to provide instructions or commands to remote assembly 202 to move in 6 DOF. In some embodiments, motion controls may comprise x-axis control 232, y-axis control 234, z-axis control 236, pitch control 238, yaw control 240, and/or roll control 242 for moving remote assembly 202 with 6 DOF. It will be appreciated however, that remote assembly 202 may comprise varying designs, and in some embodiments, may move in fewer than 6 DOF. Accordingly, in further embodiments, motion controls 230 may comprise controls configured and adapted for moving remote assembly 202 in an appropriate number of planes.

As described above, motion controls 230 may be in communication with controller 224. Instructions or commands from controller 224 may be sent to motion controls 230. Upon receipt of the instructions, the corresponding controls 232, 234, 236, 238, 240, and/or 242 may be instructed to cause movement of the remote assembly 202 based on the received instructions. As described above, one or more arms or limbs of remote assembly 202 may be configured to move with 6 DOF. Based on the instructions, the corresponding motion controls 230 may cause movement of the remote assembly 202 to correspond to the instructions.

As described above, remote assembly 202 may be communicatively coupled to computer 260. In some embodiments, computer 260 may be directly coupled to remote assembly 202, such that computer 260 and remote assembly 202 are a combined system. For example, computer 260 may be directly installed into a frame or body of remote assembly 202. Accordingly, remote assembly 202 and computer 260 may be in direct communication through cables or other direct methods. In further embodiments, computer 260 may be located external to remote assembly 202. When located externally, remote assembly 202 and computer 260 may nevertheless be communicatively coupled. For example, in some embodiments, remote assembly 202 and computer 260 may be coupled through a physical connection such as an Ethernet cable or USB cable. In further embodiments, remote assembly 202 and computer 260 may be coupled through a wireless connection, such as WiFi, Bluetooth®, cellular connection, or another wireless connection. In embodiments in which computer 260 and remote assembly 202 are connected through a wireless connection, transceiver 244 may communicate with another transceiver 250 coupled or otherwise in communication with computer 260.

In some embodiments, computer 260 may receive and process sensory information captured by remote capture device 210 of remote assembly 202. Accordingly, computer 260 may comprise at least a processor 262 for executing commands, which may include instructions for processing, analyzing, or utilizing captured sensory information. For example, as described in greater detail below, computer 260 may utilize captured three-dimensional information to generate a point-cloud, three-dimensional model, or other digital representation of an object or area captured by remote capture device 210.

In some embodiments, control system 280 may be an interface, apparatus, or system providing a user with an interactive medium for interacting with computer 260 and/or remote assembly 202. For example, in some embodiments, control system 280 may comprise at least a processor 282, at least one controller 284, at least one display 288, at least one sensor 290, and at least one transceiver 292. As described in greater detail below, some embodiments of the present teachings provide for a method of controlling remote assembly 202 from a remote location. Continuing with the running example, oftentimes telecommunications repair or powerline repair sometimes occur during or immediately after a severe weather storm. This type of scenario can be wrought with dangers such as exposed and live powerlines, high winds, lightning, and other dangers that pose a risk to human workers. Accordingly, it may be advantageous for an operator of remote assembly 202 to control remote assembly 202 in a safe location, such as in a work truck or building away from the job site. Accordingly, control system 280 may comprise at least one interfacing controller 284, providing an interactive means for a user to input commands or instructions for controlling or manipulating remote assembly 202. Controller 284 may be any interface for inputting commands or instructions that can be transmitted and processed by a computer or other hardware. By way of non-limiting example, controller 284 may comprise hand-held motion control controllers. As described in greater detail below, the motion control controllers may be beneficial for an operator to perform specific movements or actions that can be captured and relayed to remote assembly 202 to perform. Through the use of motion-control controllers, an operator may be provided with a sensory effect similar to being at the job site and performing the actions themselves. However, controller 284 is not limited to motion controls and instead, controller 284 may be any interface for an operator to input instructions or commands for remote assembly 202. For example, in further embodiments, controller 284 may be a handheld controller, similar to that of a video game controller comprising thumbsticks, buttons, triggers, and/or other interfacing inputs. In further embodiments, controller 284 may comprise a joystick and button design. In even further embodiments, controller 284 may be a mouse and keyboard. In even further embodiments, controller 284 may be configured as a glove or interactive model of a hand, allowing an operator to perform native hand manipulations which may be captured and transmitted to remote assembly 202. In even further embodiments, controller 284 may comprise a camera component or other motion capture component for capturing the movement of an operator. For example, in addition to, or in place of a physical controller handled by the operator, a camera component may capture the movement of the operator. The captured movement may be transmitted to computer 260 for translation or mapping movement of remote assembly 202. Optionally, or additionally, motion capture aids, such as motion capture dots, may also be used for capturing movement of the operator. In some embodiments, may It will be appreciated that the examples provided herein are intended to be illustrative, rather than limiting, and that controller 284 may be any apparatus or method of receiving instructions or an input from an operator.

In some embodiments, control system 280 may further comprise a power medium 286 for powering one or more parts or components of control system, including for example controller 284, display 288, or the at least one sensor 290, or any combination thereof. In some embodiments, a single power medium may power all parts or components of control system 280. In further embodiments, individual parts or components of control system 280 may comprise a separate and distinct power medium 286. For example, a first power medium 286 may be used for powering controller 284 and a second power medium 286 may be used for powering display 288. Power medium 286 may be any conventionally known power source for providing power to an electrical device, including but not limited to an internal power source such as a battery, or an external battery source such as an electrical outlet.

As further depicted in FIG. 2, control system 280 may further comprise at least one display 288. In some embodiments, display 288 may be a monitor, touchscreen, television screen, or other display. In some embodiments, at least a portion of the captured sensory information from remote capture device 210 may be displayed on display 288 for an operator to view. For example, captured video may be displayed on display 288. Providing sensory information on display 288 may provide an operator with a more immersive feel when remotely operating remote assembly 202. Through a real-time video feed, an operator may experience the job site as if the operator was physically present, even if the operator is in a safe location miles away. Additionally, providing sensory information to an operator via display 288 may aid the operator in inputting instructions or commands via controller 284.

In some embodiments, control system 280 may further comprise at least one sensor 290, which may provide additional sensory affect to the operator and/or capture additional inputs that may be used by computer 260 to provide instructions to remote assembly system 300. In some embodiments, one or more sensors may be combined with controller 284 and/or one or more sensors may be combined with display 288. For example, in some embodiments, sensor 290 may be at least one speaker or sound emitting device to provide the operator with audio information captured from remote capture device 210 or pre-recorded or pre-rendered audio. In further embodiments, the at least one sensor 290 may be one of an accelerometer, a gyroscope, a light sensor, or any other type of sensor 290 suitable to detect the viewing angle of the user or the movement, position, or angle of the operator's body.

In some embodiments, and as described in greater detail below, an operator may utilize controller 284, display 288, and the at least one sensor 290 to provide instructions to remote assembly 202, which may be analyzed and translated into instructions to cause remote assembly 202 to move or perform an action. As also described in greater detail below, an operator may input instructions or commands through control system 280. In some embodiments, inputs may be inputted or captured by a combination of controller 284 and display 288. For example, display 288 may be coupled to a head-mounted unit as described in greater detail below. An operator may move their head or torso with sensor 290 capturing the movement and/or viewing angle of the operator. The captured movement data or viewing angle may be sent to computer 260 via transceiver 292, and computer 260 may take the captured movement data or viewing angle and translate into instructions for causing remote assembly 202 to move and mimic or replicate the operator's movement and match the viewing angle of the operator.

Figure 3:
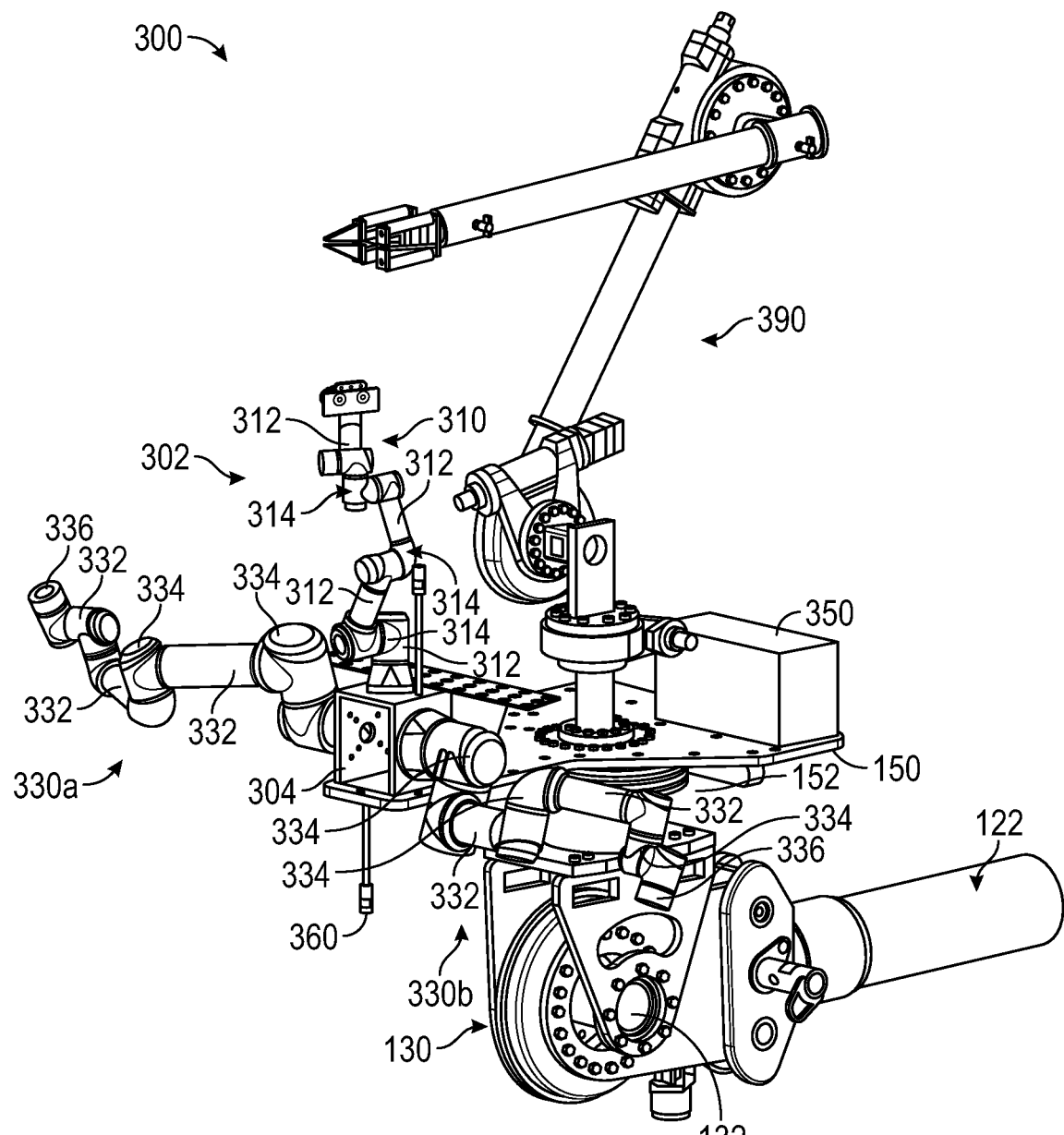
FIG. 3 depicts a six-degree-of-freedom robot unit relating to some embodiments.

FIG. 3 is an exemplary embodiment of a remote assembly system 300. In some embodiments, the remote assembly system 300 may comprise various assemblies, sub-assemblies, parts, or components, including but not limited to a robot unit 302 affixed at the end of a boom assembly 114. Further, the remote assembly system 300 may correspond to the remote assembly 202 as described above with respect to FIG. 2 and may comprise any and all of the components or parts as described above. In some embodiments, robot unit 302 may be configured and adapted to receive instructions from a computer or operator to perform a corresponding movement or action. In some embodiments, robot unit 302 may be a fully manually controlled robot, wherein the robot unit 302 will not perform a movement or action absent an instruction provided from an operator. In further embodiments, robot unit 302 may be fully a fully automated robot, wherein the robot unit 302 performs actions or movements based on pre-programmed instructions for automation. In even further embodiments, robot unit 302 may be a robot configured to respond to both manually inputted instructions and automated programming. Accordingly, the various movements or actions performed by robot unit 302 and described herein may be performed based on manually provided instructions and/or automated programming.

As described above and as illustrated in FIG. 3, in some embodiments, remote assembly system 300 may be positioned at the distal end 122 of boom assembly 114. As depicted, in some embodiments, distal end 122 of boom assembly 114 may comprise a pivot joint 130 comprising a motor 132. In some embodiments, pivot joint 130 may be used to change an angle or position of remote assembly system 300. In further embodiments, pivot joint 130 may be paired with a sensor, such as a gyroscope, to aid in maintaining a leveled position of remote assembly system 300. As further depicted in FIG. 3, pivot joint 130 may further act as an attachment point between remote assembly system 300 and boom assembly 114. For example, a base 150 may be coupled to pivot joint 130. Base 150 may be adapted and configured for receiving and coupling remote assembly system 300. Accordingly, through such coupling, remote assembly system 300 may be secured and attached to boom assembly 114. In some embodiments, base 150 may comprise a generally planar design for accepting and securing one or more assemblies, sub-assemblies, parts, or components of remote assembly system 300. Further, the size and shape of base 150 may vary, and may be dependent on design of remote assembly system 300. Further, in some embodiments, base 150 may further comprise a motorized turntable 152. Motorized turntable 152 may be a power motor train system for rotating base 150. The rotation of base 150 may be advantageous for positioning remote assembly system 300 during use.

In some embodiments, remote assembly system 300 may generally comprise a robot unit 302. Robot unit 302 may be a controllable robotics unit that can perform a range of movements and actions, such as performing repair work in a telecommunication setting. In some embodiments, and as described in greater detail below, robot unit 302 may be 6 DOF robotics assembly, configured and adapted for mimicking the movement of an operator utilizing a VR controller. Particularly, through a 6-DOF configuration, robot unit 302 may substantially mimic the torso, neck, and arm movements of the operator. Through such movement, robot unit 302 may perform a greater range of movements and/or provide a more immersive experience to an operator than pre-existing systems.

In some embodiments, robot unit 302 may comprise a central hub 304. Central hub 304 may be a central housing or base, which may house a processor, a power source, circuitry, a wireless communication means among other electronics for robot unit 302, including the components described above with respect to FIG. 2. Additionally, central hub 304 may act as a coupling or attachment member, securing robot unit 302 to base 150. Even further, central hub 304 may also act as a receiving point for one or more parts or components of robot unit 302. For example, and as described below, robot unit 302 may comprise at least one utility arm and at least one camera mount. Accordingly, central hub 304 may receive and couple with the at least one utility arm and the at least one camera arm.

To collect sensory information, including but not limited to video and three-dimensional depth information, robot unit 302 may comprise at least one camera mount 310. Camera mount 310 may be a 6 DOF, selectively controllable robotic arm, that may couple to central hub 304. As described in greater detail below, robot unit 302 may receive movement instructions or commands from computer 260 that may cause camera mount 310 to move or change position. For example, camera mount 310 may correspond to a head mount or other capture apparatus to capture the viewing angle of an operator. Instructions or commands may be relayed to robot unit 302 causing camera mount 310 to move in a corresponding manner to match the viewing angle of the operator. To enhance the operator experience, camera mount 310 may comprise a plurality of camera mount segments 312 that may be separate by motorized pivotable joints 314. The number and size of camera mount segments and pivotable joints 314 may vary depending on the embodiments and application of robot unit. Generally, in response to an instruction or commands, one or more of the pivotable joints 314 may activate to rotate or move camera mount 310. In some embodiments, the pivotable joints 314 may be used to move camera mount 310 in the X-axis, Y-axis, Z-axis as well as control the roll, pitch, and yaw of the camera mount 310. Accordingly, through movement in the 6 DOF, camera mount 310 may mimic or replicate the viewing angle of the operator. As further depicted in FIG. 3, a distal end of camera mount 310 may further comprise a sensory capture device. In some embodiments, the sensory capture device generally comprises at least one camera, three-dimensional camera, and/or sensor for capturing sensory information.

As described above, robot unit 302 may be adapted for performing repair work, maintenance work, or other similarly situation tasks or actions. To perform these actions, robot unit 302 may comprise at least one utility arm. The depicted embodiment as illustrated in FIG. 3 illustrates an exemplary embodiment of robot unit 302 comprising two utility arms 330a, 330b. Like camera mount 310 as described above, each of utility arms 330a, 330b may comprise a plurality of utility arm segments 332 that may be separate by motorized pivotable joints 334. The number and size of utility mount segments 332 and pivotable joints 334 may vary on the embodiments and application of robot unit. Generally, in response to an instruction or commands, one or more of the pivotable joints 334 may activate to rotate or move utility arms 330a, 330b. In some embodiments, the pivotable joints 334 may be used to move utility arms 330a, 330b in the X-axis, Y-axis, Z-axis as well as control the roll, pitch, and yaw of the camera mount 310. Accordingly, through movement in the 6 DOF, each utility arm 330a, 330b may mimic or replicate the movement of an operator's arms and hands. In some embodiments, the distal ends 336 of utility arms 330a, 330b may comprise one or more tools, flanges, or other apparatus for performing an action such as repair work. In some embodiments, distal ends 336 may comprise an adapter or may be otherwise configured for accepting a tool.

Remote assembly system 300 may further comprise a remote power source 350. In some embodiments, the remote power source 350 may be secured to the base 150. In further embodiments, remote power source 350 may be located within central hub 304. The remote power source 350 may be used to power camera mount 310, utility arm 330a, utility arm 330b, or any combination thereof. Remote power source 350 may be an electric generator, batteries, or any other known power source.

In further embodiments, robot unit 302 may comprise one or more additional capture devices or sensors 360 for capturing additional information that may be analyzed and/or presented to a user or operator in addition to the sensors or capture devices of sensory capture device. For example, in some embodiments, robot unit 302 may comprise a thermometer or heat sensor for capturing heat information. In some embodiments, robot unit 302 may comprise an electrical sensor for capturing electrical data. For example, robot unit 302 may be used to work on power lines or in other scenarios involving live power lines or other electrically charged wires or circuitry. accordingly, to avoid damage to the robot unit 302, the boom assembly 114, or the utility vehicle 112, at least one sensor 360 may be a sensor for detecting an electrical current. Additionally, robot unit 302 may comprise at least one sensor 360 that is at least one of an accelerometer, gyroscope, light sensor, or other sensor for detecting the positioning of camera mount 310, utility arm 330a, and/or utility arm 330b. In some embodiments, a sensor for detecting the positioning of robot unit 302 may aid in replicating or mimicking movement of an operator using motion controls. In some embodiments, the at least one sensor 360 may comprise any of an electric field sensor or an electrical current sensor. In some embodiments, a voltage sensor may be used such that hazards associated with electrical voltages without significant current may be prevented.

In some embodiments, and as depicted in FIG. 3, in addition to robot unit 302, boom assembly and remote assembly system 300 may further comprise at least one heavy utility arm 390 or additional robotics assembly that may operate separately or in conjunction with robot unit 302. For example, in many robotics applications, a delicate balance is often considered when designing the features and capabilities of a robot. Typically, robotics adapted and configured for delicate work and fine adjustments are typically not capable of transporting or holding heavy loads. Conversely, robotics adapted and configured for holding or transporting heavy loads typically lack the structural components to perform delicate or fine-tuned actions. By way of non-limiting example, in telecommunication repairs, heavy parts may need to be lifted from the ground to a telecommunication pole. Lifting a heavy part may require a robotics configured for transporting heavy loads. However, once in position, the part may need a robotics configured for delicate or sophisticated operations to install the part in position. Embodiments of the present invention solve this dilemma by pairing a robotic assembly configured and adapted for fine tuning and/or delicate work with a robotics configured and adapted for load bearing or transporting heavy loads. For example, in some embodiments, robot unit 302 may be configured and adapted for performing movements or actions directed to sophisticated, delicate, or fine-tuning work, such as unthreading wire, cutting wire, loosening screws and bolts. In some embodiments, 300 may comprise a at least one utility arm 390 for holding or transporting heavy loads that may be too heavy for robot unit 302 to safely hold and transport. Accordingly, through the combination of robot unit 302 and heavy utility arm 390, remote assembly system 300 may perform both dexterous actions and load-bearing actions.

Figure 4A:
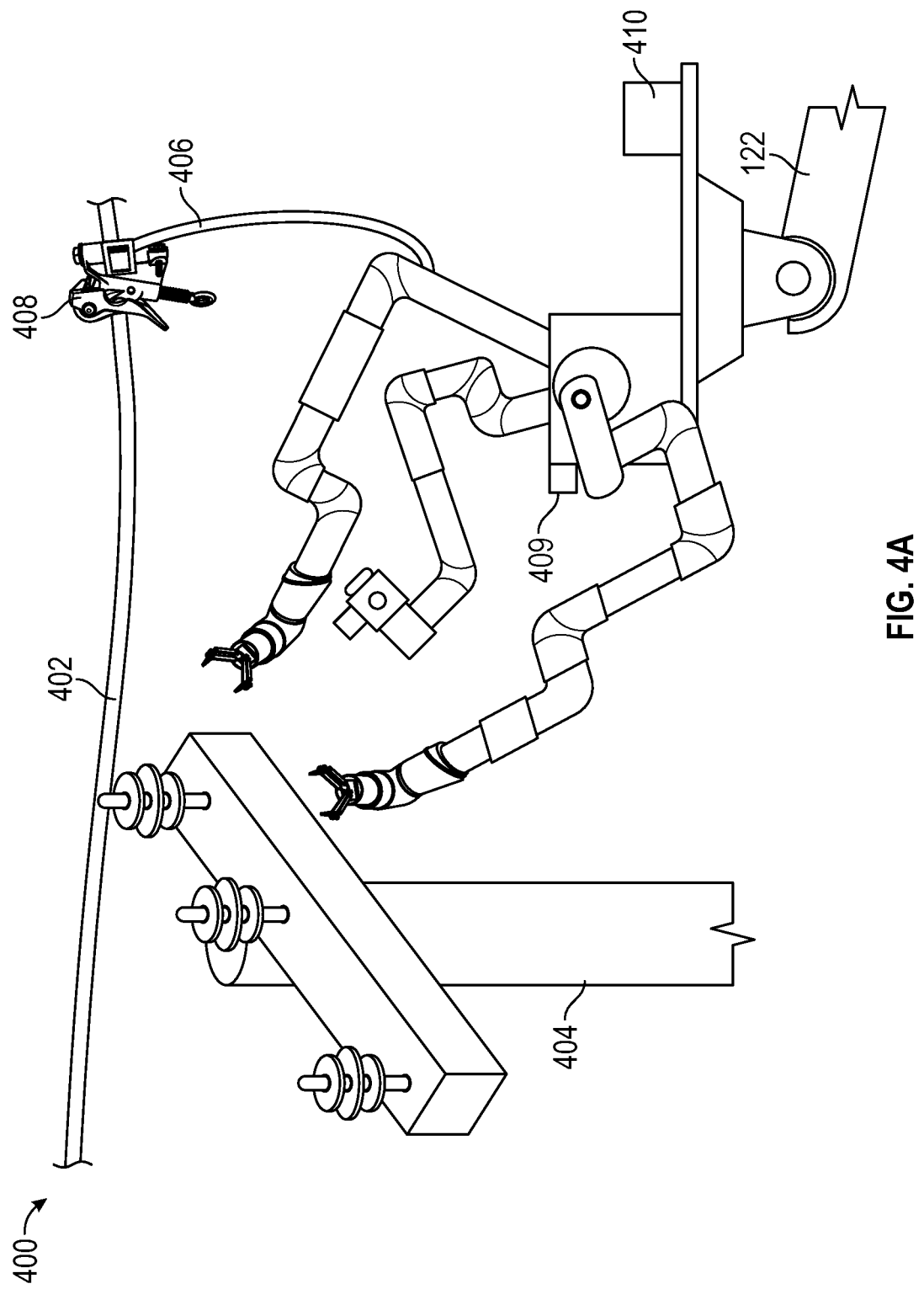
FIG. 4A depicts an exemplary operational environment of an electrical isolation system relating to some embodiments.

FIG. 4A depicts an exemplary operational environment of the remote assembly system 300 referred to generally by reference numeral 400 relating to some embodiments. In some embodiments, the remote assembly system 300 may be used to perform work on an energized power line 402 while electrically bonded to the energized power line 402, known as "barehand work". Here, the energized power line 402 may be supported by a utility pole 404 or the like. In some embodiments, the remote assembly system 300 may be bonded to the energized power line 402 via one or more bonding cables 406 attached to the energized power line 402 by one or more conductive clamps 408, as shown. In some embodiments, multiple power lines may be present. Accordingly, phase to phase contact may be avoided by placing insulated blankets over one or more additional power lines and electrically bonding to an energized power line. Further, in some embodiments, cover-ups and/or insulated blankets may be disposed over one or more support structures associated with the energized power line, which may be at ground potential. For example, cover-ups may be disposed over the utility pole 404 or a cross-bar associated therewith before electrically bonding to the energized power line 402. Further, in some embodiments, a fiber optic cable may be used to transmits signals between the remote assembly system 300 and one or more remote operators. For example, in some embodiments, at least a portion of the remote assembly system 300 may be held at an electrical potential of an energized power line while another portion of the remote assembly system 300 or of the boom assembly 114 is at a ground potential. Accordingly, a fiber optic cable or wireless transmitter may be used to transmit communications without providing an electrical path between disparate electrical potentials. In some embodiments, the robot unit 302 may be used to attach the bonding cables 406 to the energized power line 402. In some embodiments, one or more electric field sensors 409 may be included, as shown, for measuring an electric field within a work area of the robotic assembly. Further, in some embodiments, the robot unit 302 may include or interface with a power source 410 such as a battery, a generator, a capacitor bank, or other suitable energy storage device disposed on or adjacent to the robot unit 302 at the distal end of the boom.

Figure 4B:
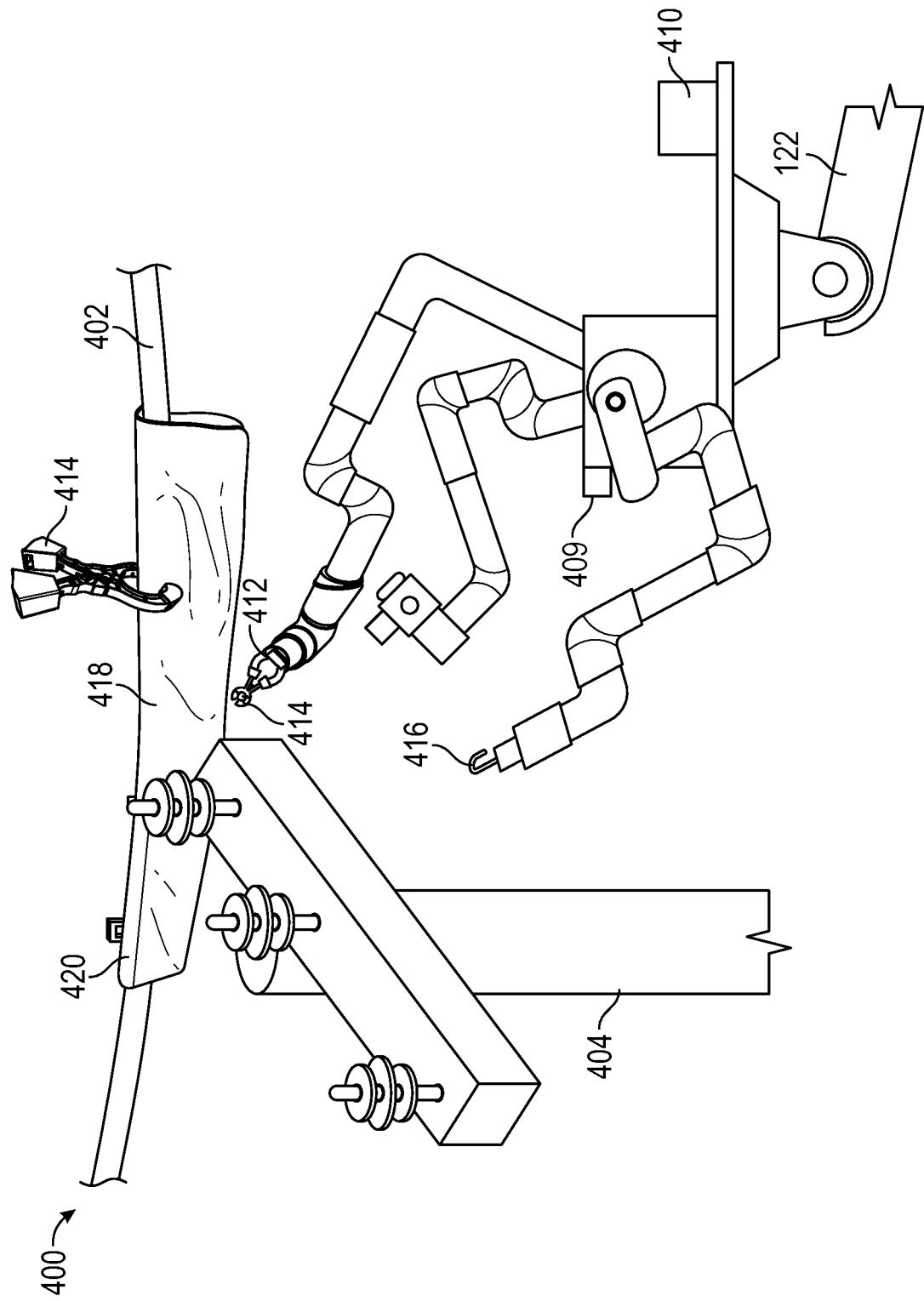
FIG. 4B depicts an exemplary operational environment of an electrical isolation system relating to some embodiments.

FIG. 4B depicts an exemplary operational environment of the remote assembly system 300 referred to generally by reference numeral 400 relating to some embodiments. Here, the remote assembly system 300 may be used to perform work on the energized power line 402 while electrically isolated from the energized power line 402, known as "gloving work". In some such embodiments, portions of the robot unit 302 may include electrically insulating covers disposed over an outer surface of the robotic components. Additionally, or in the alternative, in some embodiments, portions of the robotic assembly may include insulating materials to prevent electrical current from being conducted from the energized power line 402. In some embodiments, one or more components of the robotic assembly that are configured to work near the energized power line 402 may be electrically insulated such that the robotic assembly can be safely held at a different electrical potential than the energized power line 402. Additionally, in some embodiments, the robotic assembly may be used to perform work on non-energized power lines, low-voltage lines, cables, and other objects.

In some embodiments, the robot unit 302 may be equipped with one or more tools disposed at the end of the robotic arms. In some such embodiments, a gripping tool 412 may be disposed at an end of the robotic arm, as shown. In some embodiments, the gripping tool 412 may be used to grip onto objects or interface with other tools. For example, an insulating clamp 414 may be held by the gripping tool 412, as shown. In some embodiments, one of the robotic arms may be equipped with a hook gripping tool 416 for gripping onto other objects or cables. In some embodiments, the hook gripping tool 416 may include a retractable hook for gripping onto thin longitudinal objects such as cables. In some embodiments, any of the tools described herein may be at least partially insulated. For example, in some embodiments, the gripping tool 412 may include plastic or rubber ends or an insulated covering. Further, in some embodiments, the gripping tool 412 may comprise an electrically insulating material. Similarly, in some embodiments, the insulating clamp 414 may comprise electrically insulating materials such as plastic, fiberglass, rubber, or combinations thereof.

In some embodiments, one or more insulated blankets 418 may be placed over the energized power line 402, as shown. Here, the insulated blankets 418 may comprise an electrically insulating material such as, for example, rubber. In some embodiments, the insulated blankets 418 may be secured over the energized power line 402 via at least one insulating clamp 414. Accordingly, an insulated blanket 418 may be installed by the robot unit 302, which first places the insulated blanket 418 over the energized power line 402 and then places the insulating clamp 414 over the insulated blanket 418 to clamp the insulated blanket 418 onto the energized power line 402, as shown. Here, the insulating clamp 414 may include a portion configured to interface with the robotic arm or with the gripping tool 412 such that the insulating clamp 414 can be held and actuated by the robotic arm.

In some embodiments, an insulated blanket-holder assembly 420 may be included and placed over the energized power line 402, as shown. In some embodiments, the insulated blanket-holder assembly 420 comprises an insulated blanket 418 that is adapted to be secured to the energized power line 402 via a holder assembly, as will be described in further detail below. In some embodiments, the holder assembly is configured to be grasped and manipulated by the robotic arms and the gripping tool 412.

Operations of the remotely operated equipment are described above with respect to "barehand work" and "gloving work". However, it should be understood that embodiments are contemplated in which combinations of these work operations are provided. For example, electrical bonding may be established with an energized power line, while insulated work is performed on yet another power line, which may be energized or de-energized. Accordingly, in some embodiments, portions of the remote assembly system 300 may be electrically isolated from one another. For example, a first robotic arm may be electrically bonded to an energized power line and electrically isolated from another robotic arm or another portion of the remote assembly system 300. In some embodiments, one or more electrically insulated portions of the remote assembly system 300 comprising electrically insulating materials such as plastic, fiberglass, or other suitable insulating materials.

Figure 5:
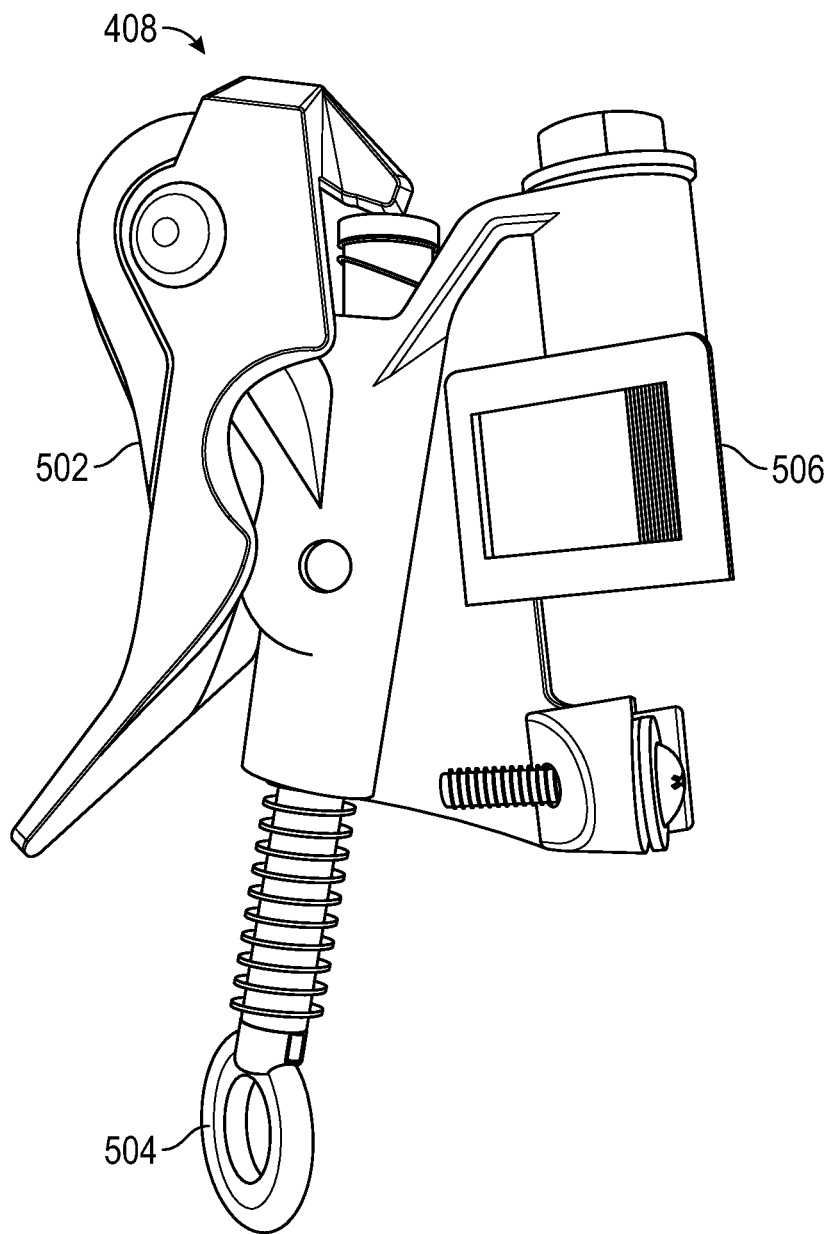
FIG. 5 depicts an exemplary conductive clamp relating to some embodiments.

FIG. 5 depicts an exemplary conductive clamp 408 relating to some embodiments. In some embodiments, the conductive clamp 408 includes a clamping portion 502 configured to clamp onto the energized power line 402, a cable, or another longitudinal object. Additionally, in some embodiments, the conductive clamp 408 includes a threaded pin 504. In some such embodiments, the threaded pin 504 may include a ring disposed on an end of the threaded pin 504, as shown. Further, in some embodiments, the conductive clamp 408 includes a robot interface adapter 506 configured to receive one or more tongs of the gripping tool 412. In some embodiments, the robot interface adapter 506 allows the robotic assembly to actuate the conductive clamp 408 for example to adjust a clamping tightness or to open the clamping portion 502.

Figure 6:
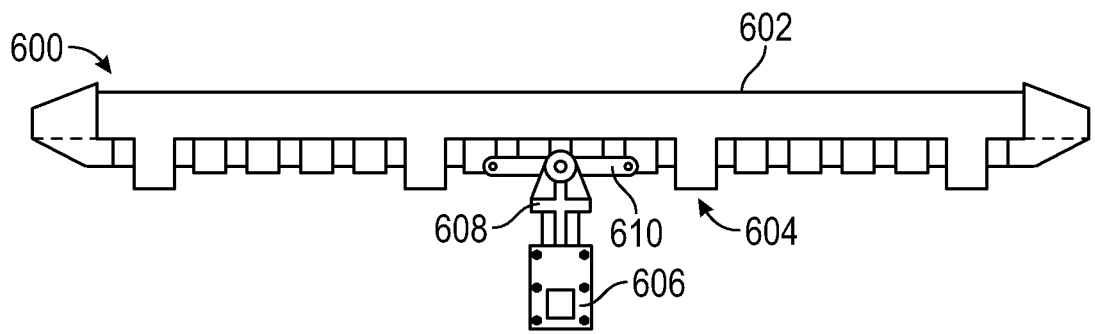
FIG. 6 depicts an exemplary line cover-up relating to some embodiments.

FIG. 6 depicts an exemplary line cover-up 600 relating to some embodiments. In some embodiments, the line cover-up 600 comprises a rigid bar section 602 with an open bottom section 604 adapted to receive a cable such as, for example, the energized power line 402. In some embodiments, the line cover-up 600 further includes a robot interface adapter 606 for interfacing with the robotic assembly. In some embodiments, the adapter 606 is disposed on an end of a hinged member 608.

In some embodiments, the hinged member 608 is pivotably attached to a mounting portion 610 that is secured to the rigid bar section 602, as shown. Accordingly, in some embodiments, the hinged member 608 is configured to pivot relative to the mounting portion 610 such that the hinged member 608 can be folded up as to not obstruct the area around the line cover-up 600. Additionally, in some embodiments, the hinged member 608 may be configured to selectably tighten the line cover-up 600 onto the energized power line 402 or another longitudinal object or cable. For example, the line cover-up 600 may be locked in place by rotating the hinged member 608 at a 90-degree angle parallel to the rigid bar section 602. In some embodiments, a connection of the hinged member 608 and the mounting portion 610 may include a threaded portion that tightens with rotation of the hinged member 608. Accordingly, the open bottom section 604 may be closed by tightening said threaded portion.

Figure 7:
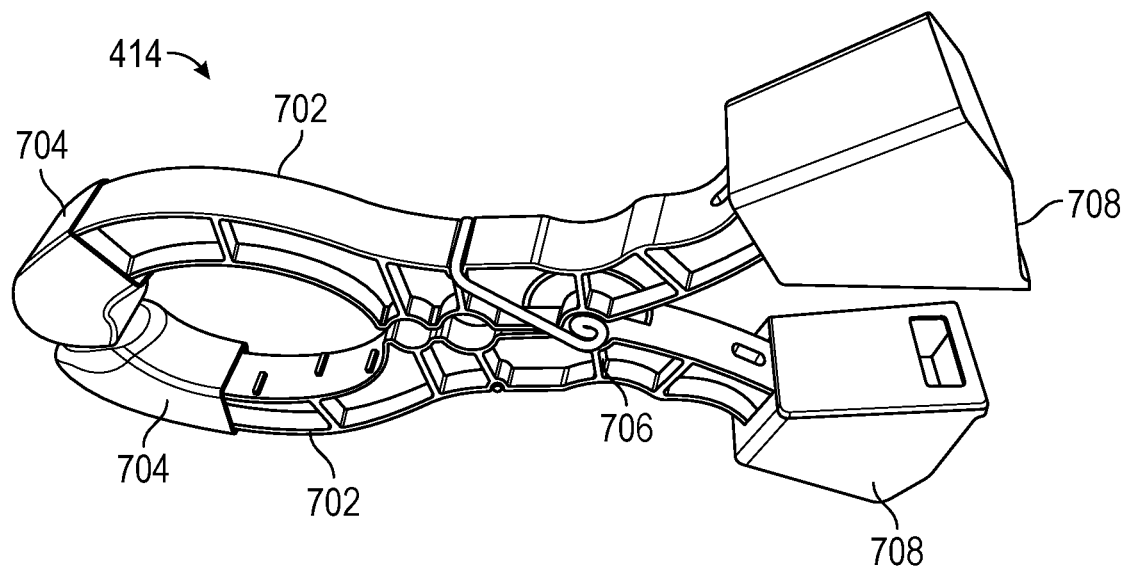
FIG. 7 depicts an exemplary insulating clamp relating to some embodiments.

FIG. 7 depicts an exemplary insulating clamp 414 relating to some embodiments. In some embodiments, the insulating clamp 414 comprises two clamp arms 702, as shown. In some such embodiments, a clamp covering 704 may be disposed over a distal end of each of the clamp arms 702. The clamp covering 704 may comprise a flexible and electrically insulating material such as rubber. Further, in some embodiments, the insulating clamp 414 comprises a biased hinged portion 706 disposed between the two clamp arms 702. The hinged portion 706 may include a spring biasing means, such as a torsion spring, as shown, for maintaining a closing force between the ends of the clamp arms 702. In some embodiments, a robot interface adapter 708 may be disposed on a proximal end of each of the clamp arms 702. In some such embodiments, the robot interface adapter 708 may be configured to interface with the robotic assembly such as with tongs of the gripping tool 412 for selectably opening and closing the insulated clamp 414.

Figure 8:
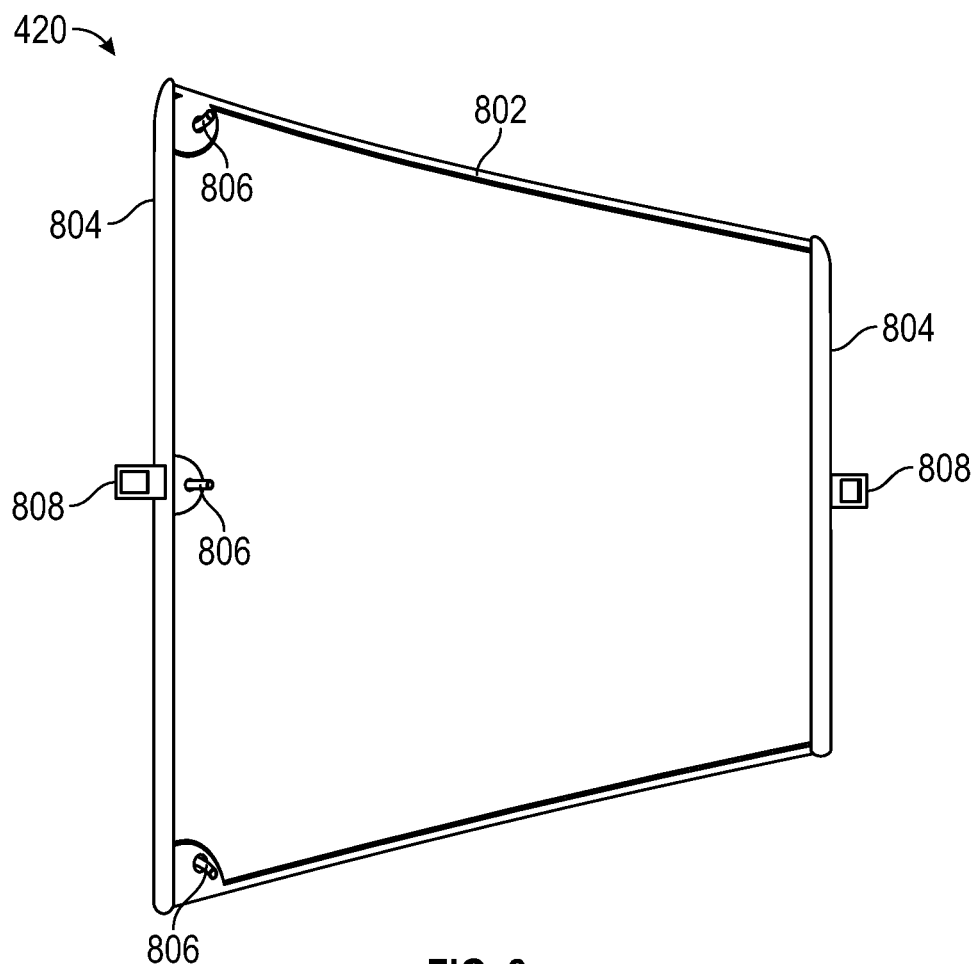
FIG. 8 depicts an exemplary insulated blanket assembly relating to some embodiments.

FIG. 8 depicts an exemplary insulated blanket-holder assembly 420 relating to some embodiments. In some embodiments, the blanket-holder assembly 420 comprises an insulated blanket 802 secured to a blanket holder rod 804, as shown. In some embodiments, the blanket holder rod 804 comprises a plurality of hooks 806 configured to interface with holes on an end of the insulated blanket 802. In some embodiments, the hooks 806 are further configured to latch onto a blanket holder rod 804 disposed at opposite end of the insulated blanket 802. Accordingly, the insulated blanket-holder assembly 420 can be disposed over an energized power line or other cable or longitudinal object by placing the insulated blanket 802 over the line, folding the insulated blanket 802 such that the blanket holder rods 804 come into contact, and locking the blanket holder rods 804 in place via the plurality of hooks 806. In some embodiments, the insulated blanket-holder assembly 420 is configured to be manipulated and positioned using the robotic assembly. Accordingly, one or more robot interface adapters 808 may be disposed on the blanket holder rods 804, as shown.

Figure 9:
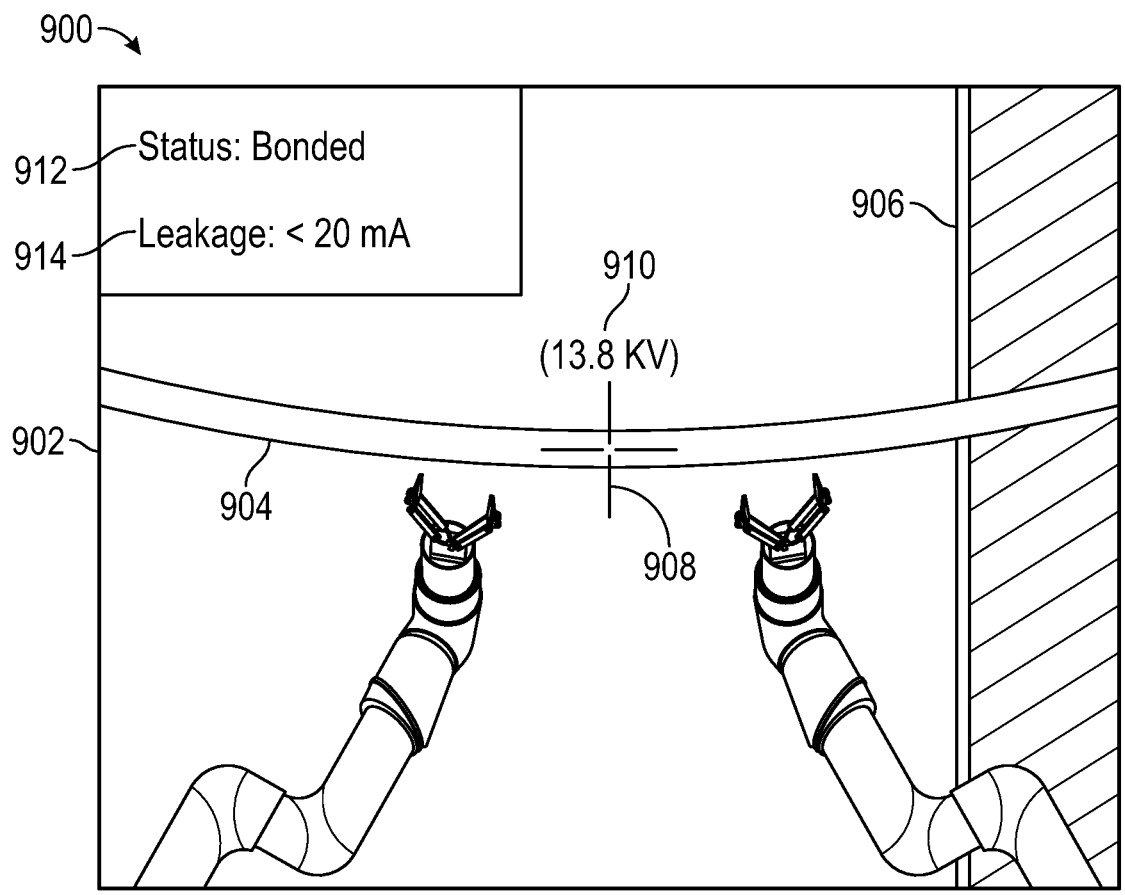
FIG. 9 depicts an exemplary user interface relating to some embodiments.

FIG. 9 depicts an exemplary user interface 900 relating to some embodiments. In some embodiments, the user interface 900 may comprise a graphical user interface generated for display on one or more user devices. For example, in some embodiments, the user interface 900 may be presented to a user via a head mounted display of a virtual reality headset. In some embodiments, the user interface 900 may include a real-time image 902, which may be an image captured by the camera assembly. Accordingly, the real-time image 902 may include a view of the work area of the robotic assembly. Here, a power line 904 may be visible within the real-time image 902.

Additionally, in some embodiments, one or more other objects 906 may be visible. In some embodiments, the objects may include indicators based on a measured electrical potential associated with the objects. For example, in some embodiments, the object 906 may include a cross-hatched pattern overlay, as shown, indicating that the object is at a different electrical potential as the robotic assembly and thus may be unsafe for the robotic assembly to come into contact with. Additionally, or in the alternative, in some embodiments, the objects at different electrical potentials may be shown (or outlined) in different colors using various overlay techniques. For example, objects at a similar electrical potential may be shown in green while objects at a substantially different electrical potential may be shown in red to inform the operator of potential damage to the robotic equipment, utility pole, and/or boom assembly. In some embodiments, high-voltage sensors, such as electric field sensors or other electrical sensors may be configured to follow a point of interest of the operator. For example, the electrical sensors may be disposed on the camera mount 310 of the remote assembly system 300 such that the electrical sensors follow a viewing angle of the operator. Additionally, or alternatively, in some embodiments, an array of electrical sensors may be included for capturing electrical data from a plurality of different angles around the work area. Accordingly, the electrical sensors may be used to monitor and avoid hazards associated with distinct electrical potentials.

In some embodiments, a 3-dimensional sensor such as a lidar camera or lidar sensor may be used to monitor a space adjacent to the aerial device or the robotic assembly. Accordingly, one or more objects may be identified and the operator can be alerted of the objects intruding the work area. In some embodiments, an intrusion notification may be transmitted to the user device of the operator indicating the identified objects. Accordingly, electric shock may be prevented by notifying operators or adjusting a motion path of the robotic assembly to avoid intruding objects at a different electrical potential.

In some embodiments, a reticle 908 may be included within the user interface 900 indicating a position of interest or a potential selection point of the operator with respect to the real-time image 902. For example, the operator may adjust the position of the reticle 908 to request additional information about objects at the position of the reticle 908. In some embodiments, additional information such as an electrical voltage potential associated with the position of interest may be displayed. For example, an estimated electrical voltage potential 910 of the power line 904 may be displayed based on the operator placing the reticle 908 over the power line 904 or hovering over the power line 904. Alternatively, in some embodiments, estimated electrical voltage potentials may be displayed independently from the presence of the reticle 908.

In some embodiments, the electrical voltage potentials may be measured by the one or more electric field sensors 409, as shown in FIG. 4A. In some embodiments, an electric field sensor may be disposed on the robotic assembly, for example, on an end of the camera arm such that the position and orientation of the electric field sensor may be selectably adjusted. Additionally, in some embodiments, electric field sensors 409 may be disposed on the robotic arms or on a separate robotic arm. In some embodiments, the one or more electric field sensors 409 may be used to measure and determine an electric voltage potential of an object within the vicinity of the remotely operated equipment. In some such embodiments, a voltage notification comprising information of the measured voltage potential of the object may be transmitted to the operator.

In some embodiments, additional information relating to the aerial device and robotic assembly may be included such as an electrical bonding status 912 indicating whether the robotic assembly and/or boom assembly is currently electrically bonded to an energized power line or other power source. Further, in some embodiments, a current leakage value 914 may be included within the user interface 900, as shown, indicating a measured current leakage of the aerial device. In some embodiments, the current leakage value 914 may be determined by measuring or estimating an electrical current leakage associated with the aerial device. Additionally, in some embodiments, an alarm may be triggered based on determining that the current leakage value 914 is above a predetermined threshold value. For example, if the current leakage value 914 is above 20 microamps an alarm may be triggered to notify one or more operators or to disable certain functions or safety stops of the aerial device. Further still, in some embodiments, a signal indicative of the electrical current leakage may be transmitted to a control system of the assembly system 300 or the boom assembly 114 such that a motion path may be updated based on the electrical current leakage to prevent further current leakage.

Figure 10:
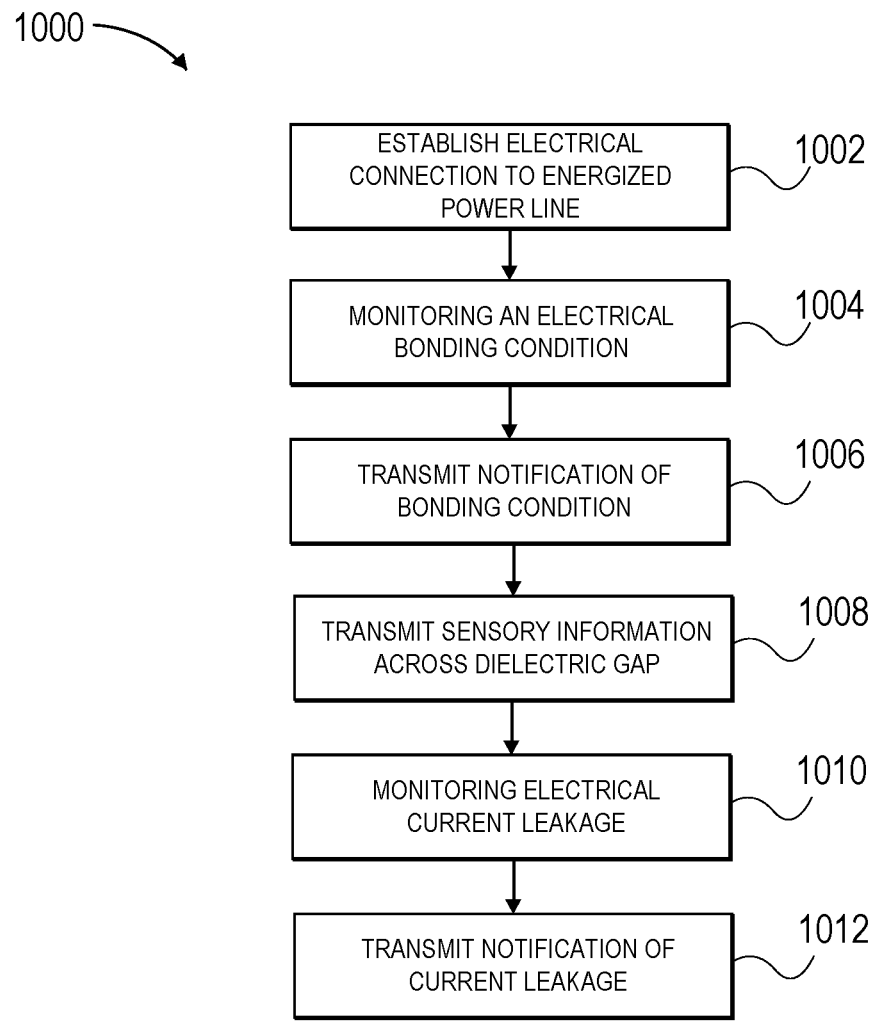
FIG. 10 depicts an exemplary method of providing electrical insulation relating to some embodiments.

Referring now to FIG. 10, an exemplary method 1000 of providing electrical insulation is depicted relating to some embodiments. In some embodiments, electrical insulation may be provided by insulating one or more portions of the robotic assembly that come into close contact with an energized power line. In some embodiments, one or more elbows or pivotably joints 314 of the remote assembly system 300 may be electrically insulated to avoid inadvertent electrical contact with one or more phases or other objects in the work area. Alternatively, in some embodiments, electrical insulation may be provided by electrically bonding a portion of the boom assembly to the energized power line and electrically insulating the portion of the boom assembly from ground potential and transmitting information across a dielectric gap. In some embodiments, any number of the steps of method 1000 may be executed by at least one processor. For example, in some embodiments, a processor may be included within a control system of the aerial device.

At step 1002, an electrical connection is established between a portion of the aerial device and the energized power line 402. In some embodiments, the electrical connection is established by using the one or more robotic arms to install conductive clamp 408 onto the energized power line 402. Here, the conductive clamp 408 may be coupled to a bonding cable which is attached to the aerial device. It should be understood that, in some embodiments, other electrical bonding techniques are also contemplated. For example, in some embodiments, one of the robotic arms may be comprise a conductive material or conductive cable such that the electrical connection may be established by moving the robotic arm into contact with the energized power line 402.

In some embodiments, the electrical bonding connection may be established by first securing a bonding rod onto the energized power line 402 and then securing the electrical bonding cable via the conductive clamp. Further, embodiments are contemplated in which one of the one or more robotic arms is used to directly establish an electrical connection with the energized power line. For example, the hook gripping tool 416 may be used to grasp the energized power line 402 thereby establishing an electrical connection while another robotic arm installs the conductive clamp 408 on the energized power line 402. In some embodiments, one or more electronics systems of the remote assembly system 300 may be temporarily shut down during a bond-on event. Additionally, in some embodiments, an additional actuator may be included for performing a bond-on operation to electrically bond to an energized power line. For example, in some embodiments, a pivotable hydraulic cylinder may be configured to place a bonding rod onto the energized power line.

In some embodiments, either of manual or automatic techniques may be used to establish the electrical connection with the energized power line. For example, in some embodiments, an operator may manually control the one or more robotic arms from a remote location to install the bonding cables. Alternatively, in some embodiments, an automated electrical bonding routine is contemplated. For example, various computer-vision techniques may be employed to identify the energized power line and automatically control the robotic arms such that the bonding cable is moved into position and installed on the energized power line. In some such embodiments, the automated electrical bonding routine may be initiated based at least in part on a request received from an operator using an input device.

At step 1004, an electrical bonding condition of the aerial device is monitored. In some embodiments, the electrical bonding condition may be monitored by measuring a voltage potential of the aerial device to determine whether the aerial device is at a substantially similar electrical potential as the energized power line 402 (or at the same electrical potential of the energized power line). At step 1006, a notification indicative of the electrical bonding condition is transmitted to one or more operators. In some embodiments, the notification may be transmitted to one or more user devices associated with respective operators. In some embodiments, the notification may be output to the operators via a visual or audible notification. For example, in some embodiments, the notification may be communicated visually as described with respect to the electrical bonding status 912, as shown in FIG. 9.

At step 1008, sensory information is transmitted across a dielectric gap between the portion of the aerial device and the operator. In some embodiments, the sensory information may be included within a communication signal configured to be transmitted across the dielectric gap without sacrificing the electrical isolation of the remotely operated equipment from ground potential. In some embodiments, the dielectric gap refers to an electrical insulated portion of the aerial device electrically isolating the portion of the aerial device electrically bonded to the energized power line from a ground electrical potential of a lower portion of the aerial device. In some embodiments, the sensory information comprises any combination of image data captured by one or more cameras of a camera assembly and audio data captured by one or more microphones. Said sensory information may include continuously captured real-time information associated with a work area of the robotic assembly.

At step 1010, an electrical current leakage of the aerial device is monitored. In some embodiments, the current leakage may be monitored using a current leakage monitoring system disposed on the aerial device. In some embodiments, an electrical current leakage of the at least one heavy utility arm 390 may be monitored while the heavy utility arm 390 is used to support an electrical phase or other object. Embodiments are contemplated in which two or more portions of the remote assembly system 300 may be held at different electrical potentials. For example, the heavy utility arm 390 may be electrically bonded to a first power line at a first electrical potential while the utility arm 330a is electrically bonded to a second power line at a second electrical potential. Accordingly, portions of the remote assembly system 300 may be electrically isolated from one another to avoid electrical hazards or damage to the remote assembly system 300. At step 1012, a notification indicative of the electrical current leakage is transmitted to the one or more operators. In some embodiments, the notification may be transmitted across the dielectric gap, as described above.

In some embodiments, the notification may be presented to the operator as described above with respect to the current leakage value 914, as shown in FIG. 9. In some embodiments, the notification may also be transmitted and displayed to additional crew members that are on-site or remote. Additionally, in some embodiments, a plurality of current leakage values 914 may be transmitted to the operator or one or more remote operators. In some embodiments, the notification may include an indication of the electrical current leakage of the heavy utility arm 390.

It should be understood that the method 1000 described above is just one example for providing electrical insulation and that a number of other methods are also contemplated. For example, in some embodiments, one or more steps may be removed and/or performed in a different order. Further, in some embodiments, additional steps not explicitly described herein may be added.

The following U.S. patent applications, each filed Jul. 28, 2022, are each hereby incorporated by reference in their entirety as if set forth herein verbatim: U.S. Application Ser. No. 63/392,927, titled "REDUCING LATENCY IN HEAD-MOUNTED DISPLAY FOR THE REMOTE OPERATION OF MACHINERY"; U.S. application Ser. No. 17/875,674, titled "MANUAL OPERATION OF A REMOTE ROBOT ASSEMBLY"; U.S. application Ser. No. 17/875,710, titled "AUTONOMOUS AND SEMI-AUTONOMOUS CONTROL OF AERIAL ROBOTIC SYSTEMS"; U.S. application Ser. No. 17/875,743, titled "COOPERATIVE HIGH-CAPACITY AND HIGH-DEXTERITY MANIPULATORS"; U.S. application Ser. No. 17/875,796, titled "ROTARY TOOL FOR REMOTE POWER LINE OPERATIONS"; U.S. application Ser. No. 17/875,893, titled "COORDINATE MAPPING FOR MOTION CONTROL"; U.S. application Ser. No. 17/875,943, titled "WIRE TENSIONING SYSTEM"; U.S. application Ser. No. 17/875,990, titled "CROSS-ARM PHASE-LIFTER"; and U.S. Application Ser. No. 63/393,047, titled "ELECTRICALLY INSULATING BLANKET WITH MEMORY SET". The subject matter described in the foregoing U.S. patent applications may be combined with the subject matter of the present disclosure. For example, one or more embodiments, features, structures, acts, etc. described in any one or more of the foregoing U.S. patent applications may be combined with one or more embodiments, features, structures, acts, etc. described in the present disclosure.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. A method of providing electrical insulation for an aerial device during operation on an energized power line, the method comprising:

establishing, via one or more robotic arms of the aerial device, an electrical connection between the energized power line and a portion of the aerial device with an electrical bonding cable to maintain the portion of the aerial device at an electrical potential of the energized power line;

monitoring an electrical bonding condition of the aerial device;

transmitting a notification to a user device associated with an operator in a remote location, the notification indicative of the electrical bonding condition of the aerial device;

while electrically bonded to the energized power line, transmitting a communication signal across a dielectric gap from the portion of the aerial device to the operator, the communication signal including sensory information associated with the one or more robotic arms;

monitoring an electrical current leakage of the aerial device; and transmitting a subsequent notification to the operator, the subsequent notification indicative of the electrical current leakage of the aerial device.

2. The method of claim 1, further comprising:
displaying the notification and the subsequent notification to the operator within a display of the user device.

3. The method of claim 1, further comprising:
determining, using one or more electric field sensors, an electrical voltage potential of an object in a vicinity of the aerial device; and
transmitting a voltage notification comprising information of the electrical voltage potential of the object in the vicinity of the aerial device to the operator.

4. The method of claim 1, wherein the electrical connection between the energized power line and the portion of the aerial device is established automatically using an automated electrical bonding routine of the one or more robotic arms.

5. The method of claim 4, wherein the automated electrical bonding routine comprises:
installing, using the one or more robotic arms, a conductive clamp over the energized power line, the conductive clamp coupled to the electrical bonding cable,
wherein the conductive clamp is adapted to be grasped by a gripping tool disposed at an end of the one or more robotic arms.

6. The method of claim 1, wherein the energized power line is a first energized power line; and further comprising:
prior to establishing the electrical connection with the first energized power line, installing, via the one or more robotic arms, an insulated blanket assembly over a second energized power line in proximity to the first energized power line, the insulated blanket assembly comprising:
an insulated blanket;
one or more blanket holders disposed at respective ends of the insulated blanket; and
one or more robot interface adapters disposed on the one or more blanket holders configured to be grasped by a gripping tool of the one or more robotic arms.

7. The method of claim 1, further comprising:
while electrically bonded to the energized power line, monitoring a space adjacent to the aerial device to identify one or more objects intruding the space; and
responsive to identifying the one or more objects intruding the space, transmitting an intrusion notification to the user device of the operator.

8. An electrical insulation system for an aerial device configured to operate on an energized power line, the electrical insulation system comprising:
a robotic assembly disposed at a distal end of the aerial device, the robotic assembly comprising:
one or more robotic arms configured to be at least partially controlled remotely by an operator in a remote location;
a camera assembly disposed at the distal end of the aerial device in proximity to the robotic assembly, the camera assembly comprising:
a camera mount secured to the distal end of the aerial device; and
one or more cameras supported by the camera mount, the camera mount configured to continuously capture image data associated with the robotic assembly; and
at least one processor programmed to perform a method of providing electrical insulation, the method comprising:
establishing, via the one or more robotic arms of the robotic assembly, an electrical connection between the energized power line and a portion of the aerial device with an electrical bonding cable to maintain the portion of the aerial device at an electrical potential of the energized power line;
monitoring an electrical bonding condition of the aerial device;
transmitting a notification to a user device of the operator, the notification indicative of the electrical bonding condition of the aerial device; and
while electrically bonded to the energized power line, transmitting a communication signal across a dielectric gap from the portion of the aerial device to the operator, the communication signal including the continuously captured image data associated with the robotic assembly.

9. The electrical insulation system of claim 8, wherein the user device comprises a headset and the notification is displayed to the operator within a display of the headset.

10. The electrical insulation system of claim 8, further comprising:
one or more insulated tools interfacing with an end of the one or more robotic arms.

11. The electrical insulation system of claim 8, further comprising:
a power source disposed at the distal end of the aerial device in proximity to the robotic assembly, the power source configured to provide electrical power to the robotic assembly and the camera assembly.

12. The electrical insulation system of claim 8, further comprising:
a hook gripping tool including a retractable hook disposed at an end of the one or more robotic arms configured to grasp one or more objects by selectably retracting the retractable hook based on an actuation by the one or more robotic arms.

13. The electrical insulation system of claim 8, further comprising:
an insulated blanket assembly configured to be placed over the energized power line, the insulated blanket assembly comprising:
an insulated blanket;
one or more blanket holders disposed at respective ends of the insulated blanket, the one or more blanket holders configured to lock the insulated blanket assembly onto the energized power line; and
one or more robot interface adapters disposed on the one or more blanket holders configured to be grasped by a gripping tool of the one or more robotic arms.

14. The electrical insulation system of claim 8, further comprising:
a fiber-optic cable disposed between the robotic assembly and the user device for communicatively coupling the robotic assembly and the user device while maintaining electrical isolation between the robotic assembly and a ground electrical potential.

15. A method of providing electrical insulation for remotely operated equipment during operation on an energized power line, the method comprising:
establishing, via one or more robotic arms of the remotely operated equipment, an electrical connection between the energized power line and a portion of the remotely operated equipment to maintain the portion of the remotely operated equipment at an electrical potential of the energized power line;
electrically isolating, via one or more electrically insulated portions of the remotely operated equipment, the portion of the remotely operated equipment at the electrical potential of the energized power line from another portion of the remotely operated equipment to prevent electrical current from traveling through the remotely operated equipment;
monitoring an electrical bonding condition of the remotely operated equipment;
transmitting a notification to a user device associated with an operator in a remote location, the notification indicative of the electrical bonding condition of the remotely operated equipment; and
while electrically bonded to the energized power line, transmitting a communication signal across a dielectric gap from the portion of the remotely operated equipment to the operator, the communication signal including sensory information associated with the one or more robotic arms.

16. The method of claim 15, further comprising:
monitoring an electrical current leakage of the remotely operated equipment; and
transmitting a subsequent notification to the operator, the subsequent notification indicative of the electrical current leakage of the remotely operated equipment.

17. The method of claim 15, further comprising:
determining, using one or more electric field sensors, an electrical voltage potential of an object in a vicinity of the remotely operated equipment; and
transmitting a voltage notification comprising information of the electrical voltage potential of the object in the vicinity of the remotely operated equipment to the operator.

18. The method of claim 17, further comprising:
generating a user interface for display within the user device of the operator, the user interface including:
the notification indicative of the electrical bonding condition of the remotely operated equipment; and
the voltage notification comprising information of the electrical voltage potential of the object in the vicinity of the remotely operated equipment.

19. The method of claim 18, wherein the user device comprises a headset and the user interface is displayed to the operator within a display of the headset.

20. The method of claim 15, further comprising:
disposing one or more electrically insulated covers over the one or more robotic arms of the remotely operated equipment.

* * * * *